(12) United States Patent
Versen

(10) Patent No.: US 7,184,337 B2
(45) Date of Patent: Feb. 27, 2007

(54) METHOD FOR TESTING AN INTEGRATED SEMICONDUCTOR MEMORY

(75) Inventor: Martin Versen, Feldkirchen-Westerham (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/212,919

(22) Filed: Aug. 29, 2005

(65) Prior Publication Data

US 2006/0044900 A1    Mar. 2, 2006

(30) Foreign Application Priority Data

Aug. 27, 2004   (DE)   ............ 10 2004 041 658

(51) Int. Cl.
*G11C 29/00* (2006.01)
(52) U.S. Cl. ................................. 365/201; 365/220
(58) Field of Classification Search ............. 365/201, 365/220, 206
See application file for complete search history.

(56) References Cited

U.S. PATENT DOCUMENTS

| 6,216,241 | B1 | 4/2001 | Fenstermaker et al. |
| 6,567,298 | B2 * | 5/2003 | Kato et al. ............... 365/149 |
| 6,898,739 | B2 | 5/2005 | Bucksch et al. |

* cited by examiner

*Primary Examiner*—Vu A. Le
(74) *Attorney, Agent, or Firm*—Edell, Shapiro & Finnan, LLC

(57) ABSTRACT

A method for testing an integrated semiconductor memory provides for disturbing memory cells arranged along a first word line by a disturbance signal on an adjacent word line. The memory cells along the first word line and bit lines, respectively, connected to them are subsequently connected simultaneously to a common data line via sense amplifiers, respectively, connected to them. The sense amplifiers assess the memory cells burdened by the disturbance signal and the capacitive load of the common data line and, respectively, refresh the disturbed memory state in the memory cells. The memory state refreshed in the memory cells is subsequently assessed in the context of a fast read access.

13 Claims, 4 Drawing Sheets

METHOD FOR TESTING AN INTEGRATED SEMICONDUCTOR MEMORY

CROSS-REFERENCE TO RELATED APPLICATION

This application claims priority under 35 USC §119 to German Application No. DE 102004041658.3, filed on Aug. 27, 2004, and titled "Method for Testing an Integrated Semiconductor Memory," the entire contents of which are hereby incorporated by reference.

FIELD OF THE INVENTION

The present invention relates to a method for testing an integrated semiconductor memory.

BACKGROUND

Semiconductor components are generally subjected to comprehensive functional tests after their fabrication. Only if these tests proceed successfully are the components shipped. The test contents relate to functionality with regard to the specification and a certain bias in numerous parametric directions, such as, for example, the voltage, the temperature and the operating frequency since the functionality of the semiconductor component is to be ensured even when the specifications are momentarily exceeded.

FIG. 1 shows an integrated semiconductor memory 100, which has a memory cell array 10 with memories cells SZ. The memory cells are generally connected in matrix form between word lines WL and bit lines BL. In the exemplary embodiment of FIG. 1, the memory cells SZ are connected to word lines WL1 and WL2 and to bit lines BL1, BL2, BL3. The memory cells are embodied as DRAM (Dynamic Random Access Memory) memory cells. An exemplary DRAM memory cell SZ13 is shown in FIG. 1 and includes a storage capacitor SC and a selection transistor AT. A control terminal of the selection transistor AT is connected to the word line WL1. In order to read from the memory cell or to write a data value to the memory cell, the selection transistor AT is controlled into the on state by a control signal on the word line WL1, so that the memory cell SZ is connected to the bit line BL3 in low-impedance fashion.

In addition to the memory cells SZ, the memory cell array of FIG. 1 also has redundant memory cells SZr that can be activated by a control signal on a redundant word line WLr for read and write accesses. In general, however, the redundant memory cells are accessed only when, in the event of a functional test of the integrated semiconductor memory, defective regular memory cells SZ have occurred that are then replaced by redundant memory cells SZr.

The function of the integrated semiconductor memory of FIG. 1 for a read or write access is explained below with reference to FIG. 2. FIG. 2 shows, in a first signal row, the profile of a clock signal CLK applied to a clock terminal T100 of the integrated semiconductor memory. The clock signal CLK is used to ensure that write and read operations are executed clock-synchronously with the clock signal CLK. Read, write, and other control operations are executed by driving a control terminal S100 of the integrated semiconductor memory with a command signal CMD. FIG. 2 shows the profile of the command signal CMD in the second signal row.

For a write access to a memory cell, for example, the memory cell SZ11 connected to the word line WL1 and the bit line BL1, an address signal AS is applied to an address terminal AD100 of the integrated semiconductor memory. The address signal is fed to an address register 50. If the control circuit 40 detects the command signal ACT at its control terminal S100, the control circuit 40 evaluates the address signal AS fed from the address register 50 and drives the word line WL1 with a control signal VPP via a word line driver 31 in a word line driver strip 30. The control signal VPP has a high level that switches the selection transistors AT of the memory cells SZ11, . . . , SZ1n connected to the word line WL1 into the on state. At the same time, the remaining word lines of the memory cell array 10, of which only the word line WL2 and the redundant word line WLr are illustrated in FIG. 1 for simplicity, are driven by a control signal VLL generated by the word line drivers 32 and 31r. The control signal VLL has a low level in comparison with the control signal VPP. The low level switches the selection transistors of the memory cells SZ21, . . . , SZ2n connected to the word line WL2 and the selection transistors of the redundant memory cells SZr connected to the redundant word line WLr into the off state.

Via the selection transistors AT of the memory cells SZ connected to the word line WL1 that are turned on, the storage capacitors SC of these memory cells are connected to the bit lines BL1, BL2 and BL3 in low-impedance fashion.

In order to write a data value to one of the memory cells of the word line WL1, a write command signal WR is applied to the control terminal S100. Based on the address signal AS, the control circuit 40 then selects one of the memory cells activated by the control signal VPP of the word line WL1 connected to a data input and output terminal DIO for writing an item of information. If an item of information is to be written to the memory cell SZ11 connected to the word line WL1 and the bit line BLI, a sense amplifier LV1 in a sense amplifier strip 20 connected to the bit line BL1 is activated. As a result of control terminal SLV1 being driven with a control signal CSL from the control circuit 40, the sense amplifier LV1, in the activated state, connects the bit line BL1 to a local data line LDQ. Further sense amplifiers LV2, LV3 connected to the bit lines BL2, BL3 are driven with a complementary control signal/CSL at their control terminals SLV2, SLV3 by the control circuit 40. The sense amplifiers LV2, LV3 are therefore controlled in high-impedance fashion, so that the bit lines BL2, BL3 connected to them are isolated from the local data line LDQ. The local data line LDQ is connected to a main data line MDQ via a controllable switch 60. The main data line MDQ is connected to the data input and output terminal DIO via an amplifier 70. A data signal present at the data input and output terminal DIO is amplified by the amplifier 70, fed via the controllable switch 60, the local data line LDQ, the sense amplifier LV1 controlled in low-impedance fashion, and the bit line BL1, and via the selection transistor controlled into the on state to the activated memory cell SZ11, and is stored therein. The selection transistors of the memory cells SZ11, . . . , SZ1n are turned off again after the end of the storage operation.

After a data retention time TR has elapsed, the data value written in the memory cell SZ11 is refreshed again since, despite the selection transistor of the memory cell SZ11 controlled in high-impedance fashion, leakage currents occur that lead to a slow flowing away of the charge stored on the storage capacitor SC of the memory cell SZ11. Such a refresh operation is carried out internally without the control circuit 40 being driven with an external command signal. The data contents of the memory cells connected to a common word line are refreshed during the refresh operation. In order to refresh the data contents of the memory cells SZ11, ..., SZ1n, the selection transistors of these memory cells are controlled into the on state again by the control signal VPP on the word line WL1. The sense amplifiers LV1, ..., LVn then again refresh the charge level stored in the memory cells SZ11, ..., SZ1n with a full high or low charge level. The selection transistors are subsequently turned off again.

A read access to the memory cell SZ11 is described below with reference to FIGS. 1 and 2. The address register 50 is driven with the address of the memory cell SZ11 at the address terminal AD100. The control circuit 40 is again driven by the control signal ACT, and evaluates the address that is buffer-stored in the address register 50 based on the address signal AS. The control signal VPP is again applied to the word line WL1 connected to the memory cell SZ11, whereas the control signal VLL is applied to the remaining word lines. The selection transistors of the memory cells SZ11, ..., SZ1n are thereupon switched into the on state, whereas the selection transistors of the memory cells SZ21, ..., SZ2n of the word line WL2, for example, remain turned off. Depending on the charge level that was stored in the memory cells SZ11, ..., SZ1n, a potential change, a signal swing occurs on the bit lines BL1, ..., BLn. After a signal development time, the signal swing is developed with a sufficient level on the bit lines such that it can be detected by the sense amplifiers LV1 ..., LVn and written back to the respective memory cells SZ11, ..., SZ1n again after having been amplified. Thus, during the read-out operation, a simultaneous refresh operation of the memory cells connected to the word line WL1 activated by the control signal VPP takes place.

As a result of the control circuit 40 being driven with the external command signal RD, the sense amplifier is activated for assessing the potential state on the connected bit line. As a result of the activated sense amplifier LV1 being driven with the control signal CSL by the control circuit 40, the bit line BL1 is thereupon connected to the local data line LDQ in the sense amplifier LV1. The signal swing on the bit line BL1 amplified by the sense amplifier LV1 is fed via the local data line LDQ and the controllable switch 60 to the main data line MDQ, where the signal is amplified once again by the amplifier 70 and fed to the data input and output terminal DIO, at which it can be tapped off externally.

The remaining sense amplifiers LV2, ..., LVn are driven by the complementary control signal/CSL, which each controls the sense amplifiers in high-impedance fashion. As a result, the bit lines BL2 and BL3 are isolated from the local data line LDQ.

As described above, by the control signal CSL, during the read-out of the memory cell SZ11, the bit line BL1 is connected in low-impedance fashion to the local data line LDQ via the sense amplifier LV1. In this case, the local data line LDQ represents a high capacitive load CL for the sense amplifier LV1. In some cases, this high capacitive load may entail incorrect writing back of the memory state of the memory cell to be read. The problem occurs, in particular, when the integrated semiconductor memory, after the command signal ACT, is driven by the command signal RD after a time period shorter than a critical delay time TRCD (Row Address to Column Address Delay).

In this case, the critical delay time TRCD is the time duration that lies between the external command signal ACT and the external command signal RD in order that the signal swing, the potential change, has developed on the bit line sufficiently in order that the sense amplifier can detect the small signal swing and can subsequently amplify it in one direction or the other, i.e., in the direction of a high voltage potential or in the direction of a low voltage potential.

Therefore, if a shorter time duration than the time duration of the critical delay time TRCD lies between the command signal ACT and the command signal RD, often the signal swing on the bit line has not yet developed sufficiently. The large capacitive load of the local data line LDQ then shifts the small potential change on the bit line, which is currently developing in one direction, in the opposite direction. The sense amplifier thus detects a signal swing which, for example, instead of lying above a threshold value, now lies below the threshold value. The threshold value may, for example, be the potential state on a complementary bit line likewise connected to the sense amplifier. Consequently, instead of a high charge level, a low charge level is now written back to the memory cell to be read. Instead of the data value originally stored in the memory cell, the complementary data value with respect thereto occurs at the data input and output terminal. In the case of a healthy bit line, the influencing by the capacitive load should not give rise to a polarization reversal above or below the threshold value, if the time duration of the critical delay time lies between the command signal ACT and the command signal RD. In case of a sick bit line, however, such a polarization reversal already occurs, in general, during the critical delay time.

A functional test of the integrated semiconductor memory involves testing whether the capacitive load of the local data line LDQ, during a read-out operation with the critical delay time TRCD, effects a rewriting of the data value to be read out by the sense amplifier.

FIG. 3 illustrates the individual test steps of the functional test in a signal flow diagram. At the beginning of the test, a first memory state H, corresponding to a memory state "1," for example, is stored in the memory cells of the memory cell array 10. A second memory state L, for example, a memory state #0 is subsequently written to the memory cells connected to the word line WL1 allocated a word line address #0, and to memory cells connected to word lines with the word line addresses #4, #8, ... The further word lines with the addresses #4, #8 are not illustrated for the sake of better clarity in the memory cell array 10.

For the duration of the data retention time TR, for example, for 64 ms, a disturbance signal is subsequently fed to adjacent word lines. In the example of FIG. 3, for the word line WL1 with the word line address #0, the associated disturbance signal is fed to the word line WL2 with the word line address #F, for the word line with the word line address #4 the disturbance signal is fed to the word line adjacent thereto with the word line address #3, and for the word line with the word line address #8 the disturbance signal is fed to the adjacent word line with the word line address #7. The disturbance signal on the adjacent word lines represents, for example, a fast change of the control signals VPP and VLL, which corresponds to a fast change between a high and low voltage potential on the adjacent word lines.

In order to examine the context of the functional test, for example, whether the memory state "0" in the memory cells of the word line WL1 has been disturbed by the high-frequency disturbance signal along the word line WL2, the individual memory cells SZ11, ..., SZ1n connected to the word line WL1 are read and the memory state read out is compared with the value "0." In this case, the read access is effected with the critical delay time TRCD. Firstly, a sense amplifier is activated, detects the instantaneous potential state on the bit lines connected to it, and starts to amplify the potential state in one direction or the other depending on whether it lies above or below the threshold value. During this amplification operation, the activated sense amplifier is driven by the control signal CSL. The bit line connected to the activated sense amplifier is thereby connected to the common data line LDQ. The memory content stressed by the disturbance signal of the memory cell to be read or the instantaneous potential state on the bit line connected to the relevant memory cell is thus also exposed to the capacitive load CL of the common data line LDQ. The capacitive load CL may effect, in particular on a sick bit line, as a further cause of error, a rewriting of the originally stored memory state to the memory cell to be read in that the instantaneous potential state on the bit line experiences a disturbance such that, instead of lying below the threshold value, for example, it now lies above the threshold value.

Since a read access to one of the memory cells, for example, to the memory cell SZ11, as described in the introduction, simultaneously results in an operation of refreshing the data content of the remaining memory cells SZ12, ..., SZ1n likewise connected to the word line WL1, the entire test procedure, i.e., the preallocation of the first memory state "1" to the memory cells, the writing of the second memory state "0" to the memory cells SZ11, ..., SZ1n to be tested, the driving of an adjacent word line WL2 with a disturbance signal during the data retention time TR, and the concluding read-out of only a single memory cell, has to be repeated for each memory cells SZ11, ..., SZ1n connected to the word line WL1. Only when all memory cells SZ11, ..., SZ1n from the bit line BL1 with a bit line address $y_{start}$ through to the bit line BLn with a bit line address $y_{end}$ have been read is the functional test ended.

Since the time duration during which the disturbance signal is fed in on the adjacent word line WL2, i.e., the data retention time TR, represents the significant test time factor of a test time $T_{Test}$, the functional test described requires, for a memory cell array having n memory cells to be tested, in total a test time $T_{Test} \approx n*TR$. Consequently, for 1024 memory cells to be tested along a word line, the result is a total test time $T_{Test}$ of approximately 65 s.

A method for testing an integrated semiconductor memory that reduces the required test time, and applicable, in particular, to functional tests of an integrated semiconductor memory to test whether the memory content of memory cells connected to a word line is influenced by a disturbance signal on an adjacent word line, is desirable. An integrated semiconductor memory in which the required test time for carrying out a functional test in which the memory content of memory cells connected to a word line is influenced by a disturbance signal on an adjacent word line is reduced is also desirable.

SUMMARY

A method for testing an integrated semiconductor memory includes providing an integrated semiconductor memory with a memory cell array having memory cells each connected to a word line and a bit line. In the case of the integrated semiconductor memory, a respective one of the memory cells is connected in low-impedance fashion or in high-impedance fashion to the word line connected to them. Furthermore, the bit lines can be connected to a common data line. According to the invention, a first memory state is written for the memory cells of the memory cell array. Afterward, a second memory state is written to the memory cells connected to a first of the word lines. A disturbance signal for disturbing the memory state of the memory cells connected to the first of the word lines is then generated. The memory cells connected to the first of the word lines are then connected in low-impedance fashion to the bit line respectively connected to them. As a result, a potential state forms on each of the bit lines connected to one of the memory cells connected to the first of the word lines. The bit lines connected to one of the memory cells connected to the first of the word lines are then momentarily and simultaneously connected to the common data line, so that the respective potential states of the bit lines connected to one of the memory cells connected to the first of the word lines experience a disturbance brought about by a capacitive load of the common data line, and the disturbed memory states of the memory cells connected to the first of the word lines are refreshed by assessment of the respectively disturbed potential states of the bit lines. The bit lines connected to one of the memory cells connected to the first of the word lines are then isolated again from the common data line, thereby avoiding a charge equalization between the bit lines connected to one of the memory cells connected to the first of the word lines. The respective memory state of the memory cells connected to the first of the word lines is subsequently read out.

The method according to the invention relates, in particular, to functional tests in which memory cells connected to a word line are disturbed equally by a disturbance signal on an adjacent word line. Hitherto it has only been possible to connect one bit line to the common data line. In this case, however, the memory content of the remaining stressed memory cells was simultaneously refreshed. As a result, these memory cells no longer have the memory state that they assumed due to the disturbance signal. Consequently, only that memory cell connected to the local data line for the read-out of its memory state could be assessed in the previous method. For all other memory cells, the entire test sequence, in particular, the disturbance of the adjacent word line, had to be repeated in accordance with the number of memory cells to be tested.

In accordance with the method according to the invention, the disturbance signal on the adjacent word line is now generated only once. The sense amplifiers connected to the memory cells are then driven such that the sense amplifiers simultaneously connect the bit lines connected to the memory cells stressed by the disturbance signal to the common data line. The disturbed memory state of the memory cells to be tested is therefore simultaneously exposed to a capacitive loading of the common data line. In defective memory cells that have not withstood the loading by the disturbance signal and the subsequent capacitive loading stemming from the connection of their respective bit line to the common data line, an incorrect memory state is written back by the sense amplifiers in the context of a refresh operation that takes place simultaneously for the stressed memory cells. In functional memory cells that have withstood the loading by the disturbance signal and the loading by the large capacitive load of the common data line, the memory state that was written in originally is written back. The memory cells are subsequently read successively in the context of a fast read access. The method according to the invention thus enables fast testing of the stressed memory cells since the disturbance signal on the adjacent word line only has to be generated once.

In accordance with one implementation of the method for testing an integrated semiconductor memory, the functional test is carried out on an integrated semiconductor memory in which the memory state that was written to the memory cells has to be refreshed at the latest after a data retention time in order to prevent an alteration of the memory state. According to the invention, a first and second level of the disturbance signal, serving, for example, for controlling selection transistors into the on state and into the off state, are generated on a second of the word lines, which, for example, lies in direct proximity to the first of the word lines, during the data retention time. This results in a repeated refreshing of the memory state of the memory-cells connected to the second of the word lines.

In accordance with a further embodiment of the method according to the invention, an integrated semiconductor memory is tested in which the sense amplifiers detect a potential change on the bit line respectively connected to them, and in which the sense amplifiers each write the first memory state back to the memory cells connected to the respective bit line, if the potential changes lies above a threshold value, and each write the second memory state back to the memory cells, if the potential change lies below the threshold value. As a result of controlling into the on state the respective selection transistors of the memory cells connected to the first of the word lines, a first potential change is each generated on the bit lines. As a result of the subsequent simultaneous connection of the bit lines connected to one of the memory cells connected to the first of the word lines, via the sense amplifiers to the common data line, a second potential change is generated on the respective bit lines. The sense amplifier connected to the respective bit line evaluates the corresponding second potential change on the bit line assigned thereto. The sense amplifier writes the first memory state back to the memory cell connected to it via the respective bit line, if the second potential change lies above the threshold value. Conversely, the second memory state is written back, if the second potential change lies below the threshold value.

In accordance with one implementation of the method, the bit lines connected to one of the memory cells connected to the first of the word lines are simultaneously connected via the sense amplifiers to the common data line. There is a delay time between controlling the respective selection transistors of the memory cells connected to the first of the word lines into the on state and the simultaneous connection of the bit lines connected to one of the memory cells connected to the first of the word lines to the common data line. The delay time is at least necessary in order for the sense amplifier connected to the respective bit line to detect the potential change on the respective bit line for refreshing the memory state of the memory cell connected to the respective bit line.

An integrated semiconductor memory is specified below, in which the required test time for carrying out a functional test in which the memory content of memory cells connected to a word line is influenced by a disturbance signal on an adjacent word line is reduced. The integrated semiconductor memory according to the invention has a memory cell array having memory cells connected to a bit line and a word line. The memory cells are connected to the respective bit line in low-impedance fashion in an activated state and are connected to the respective bit line in a high-impedance fashion in a deactivated state. The integrated semiconductor memory according to the invention has a data line, sense amplifiers via which the bit lines can be connected to the data line, and a control circuit to activate the memory cells connected to a first of the word lines due to a potential state that forms on each of the bit lines connected to one of the activated memory cells. Furthermore, the control circuit drives the sense amplifiers simultaneously with a control signal, so that the bit lines connected to one of the activated memory cells are connected via the sense amplifiers simultaneously to the data line. As a result, the respective potential states of the bit lines connected to one of the activated memory cells experience a disturbance essentially brought about by a capacitive load of the data line. The disturbed memory state of the activated memory cells is refreshed by assessing the respectively disturbed potential states of the bit lines. The bit lines connected to one of the activated memory cells are isolated from the data line again, thereby avoiding a charge equalization between the bit lines connected to one of the activated memory cells.

In accordance with another embodiment of the method for testing an integrated semiconductor memory, an integrated semiconductor memory with redundant word lines to which redundant memory cells are connected is provided. The respective memory state of the memory cells that are read is compared with the second memory state previously written. The first of the word lines is replaced by one of the redundant word lines, if the read-out memory state of one of the memory cells connected to the first of the word lines differs from the second memory state.

BRIEF DESCRIPTION OF THE FIGURES

The invention is explained in more detail below with reference to the figures showing exemplary embodiments of the present invention. In the figures.

DETAILED DESCRIPTION

In accordance with the method according to the invention for testing an integrated semiconductor memory, at the beginning of the test, a first memory state, for example, the memory state "1," is stored in the memory cells of the memory cell array. Afterward, a second memory state, for example, the memory state "0," is written to the memory cells connected to the word line WL1 assigned the word line address #0, for example. In addition to the word line WL1 with the word line address #0, the second memory state is also written to more remote word lines in the memory cell array with the word line addresses #4, #8, . . . .

Figure 1:
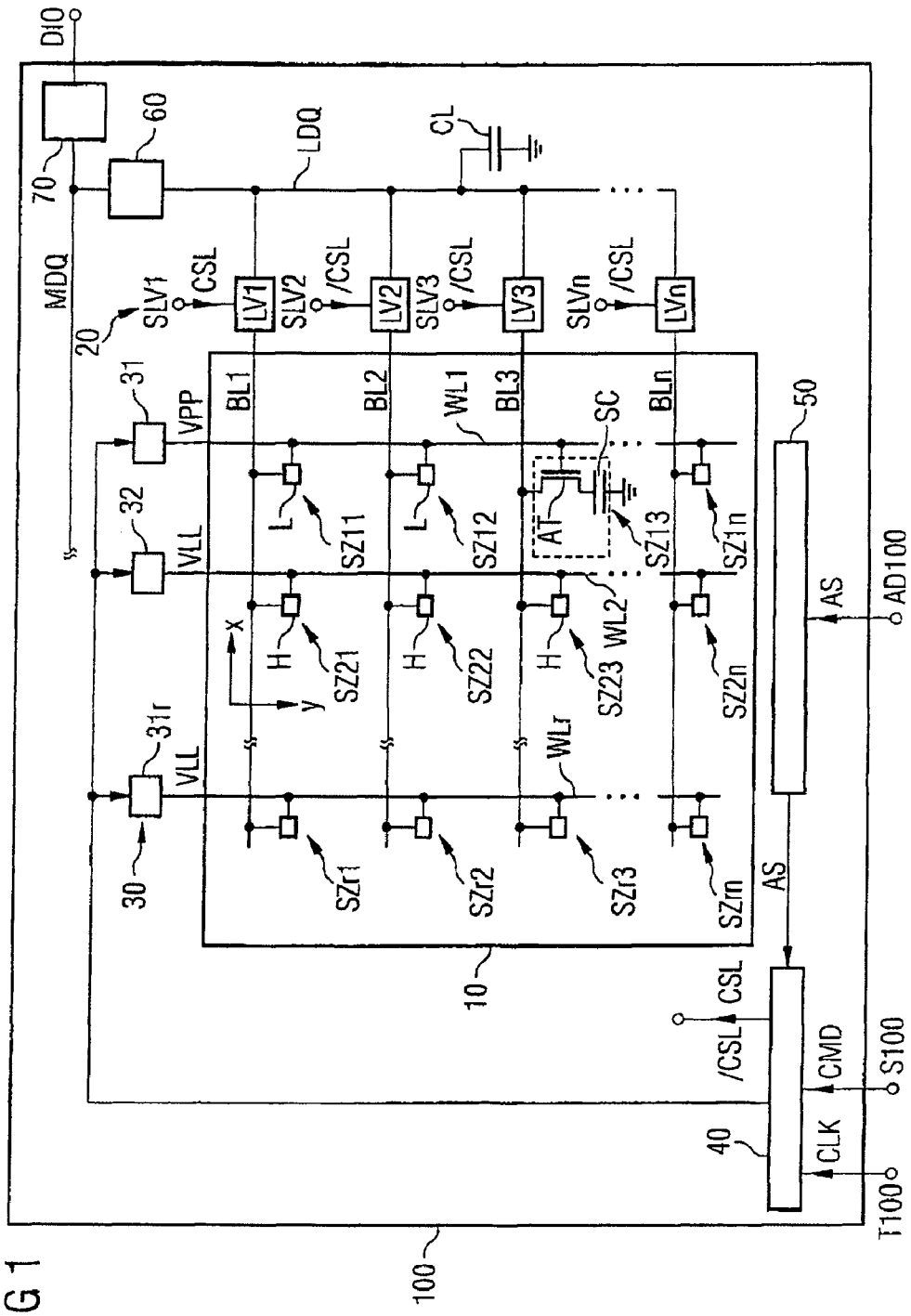
FIG. 1 shows an integrated semiconductor memory for carrying out a functional test in accordance with the invention.
Figure 2:
FIG. 2 shows a signal state diagram for a writing, refreshing and reading operation of an integrated semiconductor memory in accordance with the invention.

In a subsequent test step, a disturbance signal is fed in on word lines adjacent to the word lines with the word line addresses #0, #4, #8 . . . , for example, word lines with the word line addresses #F, #3, #7, . . . In the example of FIG. 1, therefore, a disturbance signal is fed in, for example, on the word line WL2 adjacent to the word line WL1. In this case, the disturbance signal corresponds, for example, to a high-frequency change of a voltage level on the adjacent word line WL2. During the duration of the data retention time TR, the control circuit 40 generates the control signal VPP for controlling the selection transistors of the word line WL2 into the on state and the control signal VLL for turning off the selection transistors of the word line WL2 in a high-frequency alternation.

The functional test examines whether the memory state or the memory content of the memory cells connected to the word line WL1 has been destroyed or corrupted by the high-frequency disturbance signal on the adjacent word line WL2. The memory state of the stressed memory cells SZ11, ..., SZ1n along the word line WL1 are read out and assessed. When reading from the memory cells, however, as described above, a further disturbance occurs in that the small signal swing that forms after the selection transistors are controlled into the on state due to the command signal ACT on the bit lines BL1, ..., BLn being influenced by the capacitive load of the common data line LDQ. In the worst-case scenario, the memory content is written back to the memory cell to be read or the memory content of the memory cell is read out by the sense amplifier with an incorrect value. This situation occurs in the case of sick memory cells or sick bit lines, if the critical delay time TRCD or a shorter time interval lies between the activation of the selection transistors and the subsequent activation of the sense amplifiers.

Figure 3:
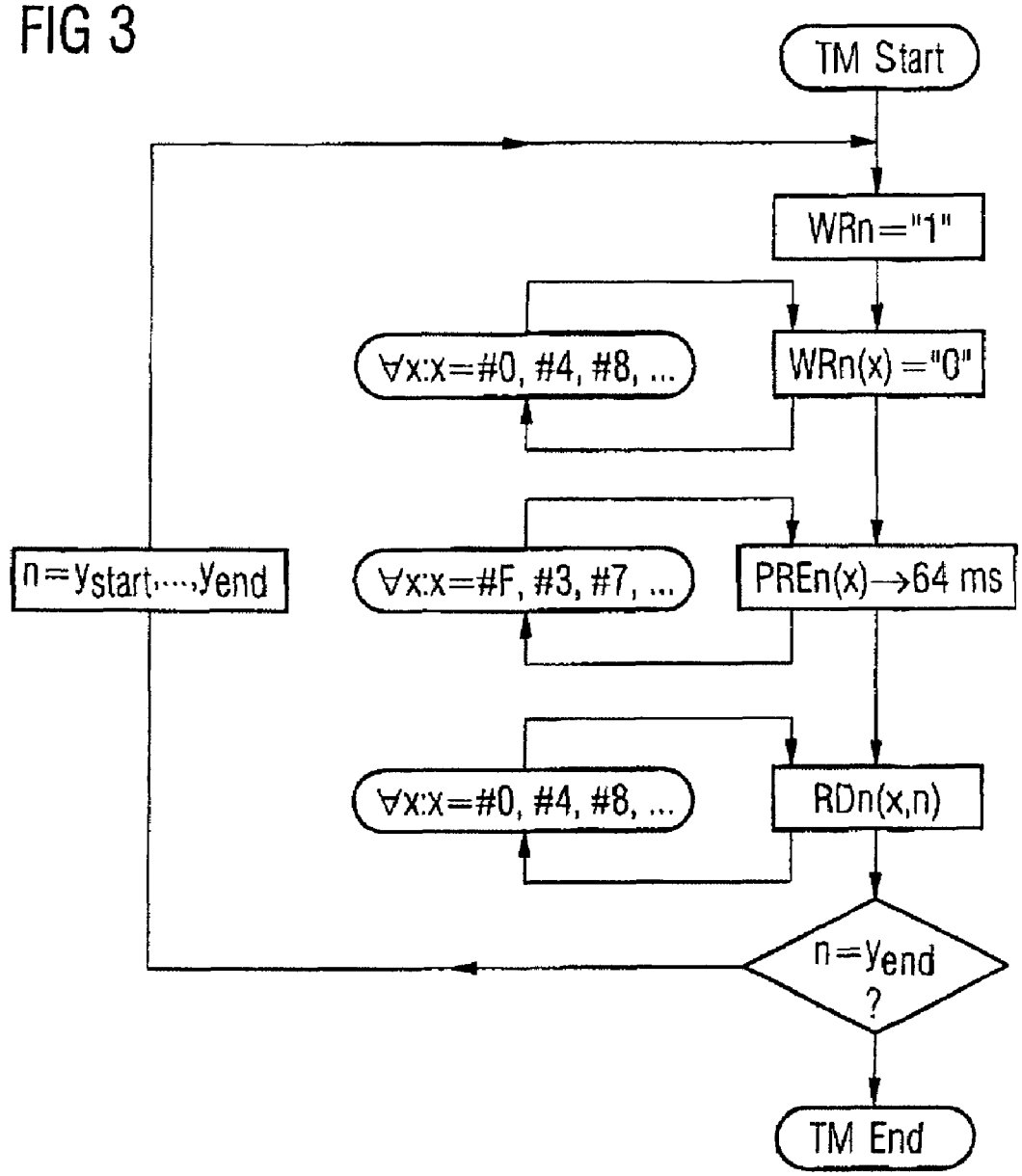
FIG. 3 shows a method for testing an integrated semiconductor memory in accordance with the prior art.
Figure 4:
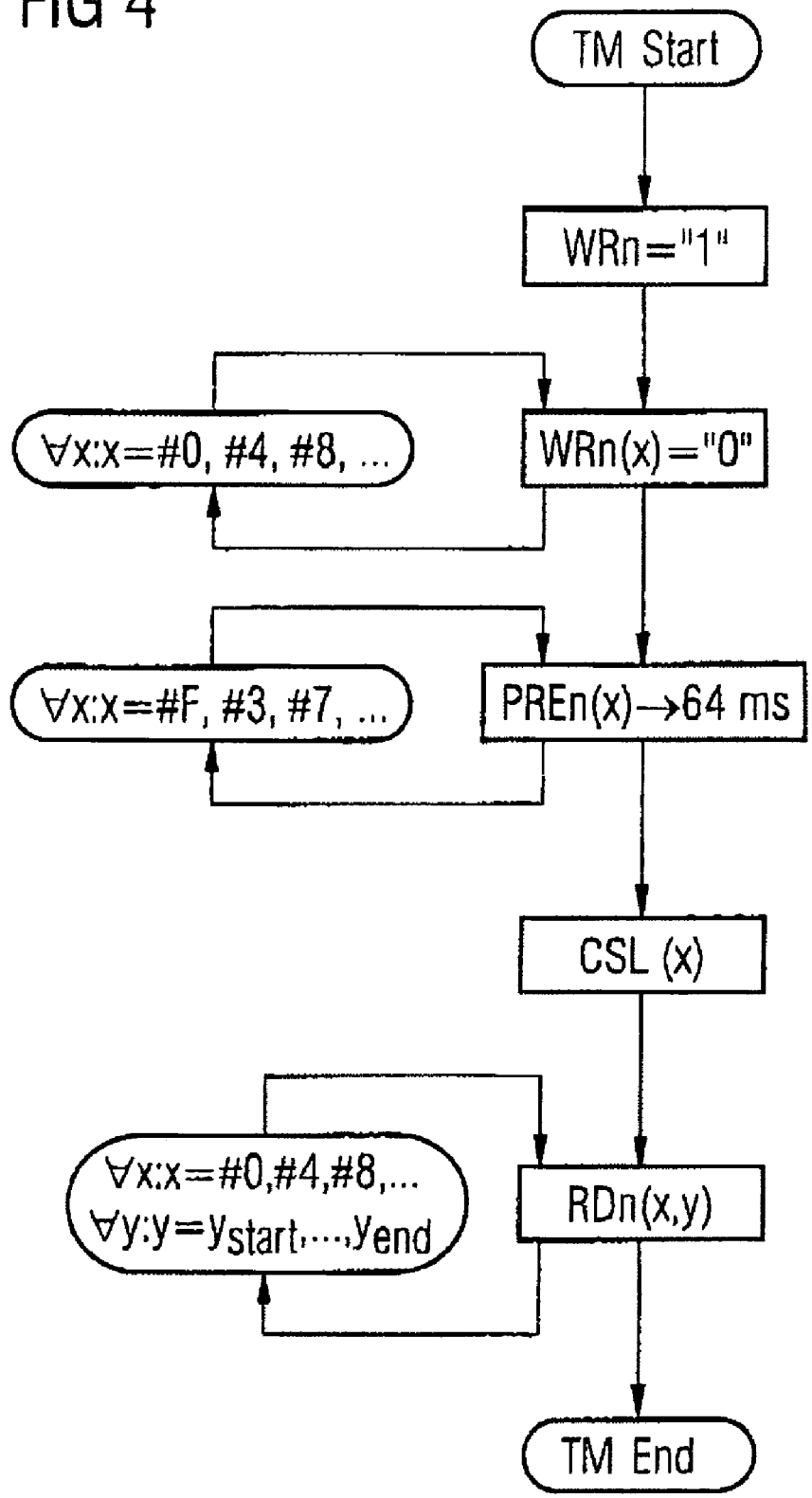
FIG. 4 shows a method for testing an integrated semiconductor memory in accordance with the invention.

In order to reliably detect sick memory cells or bit lines, the sense amplifiers LVl, LVn are therefore activated with the critical delay time TRCD. In contrast to the previous method described in FIG. 3, after the activation of the sense amplifiers LV1, ..., LVn, according to the invention, stressed memory cells SZ11, ..., SZ1n along the word line WL1 are now connected via their bit lines BL1, ..., BLn simultaneously to the common data line LDQ.

In contrast to earlier methods, in which only that bit line of the memory cell to be read, for example, the bit line BL1 of the memory cell SZ11, was connected to the common data line LDQ, all sense amplifiers LV1, ..., LVn of the sense amplifier strip 20 are driven simultaneously with the control signal CSL by the control circuit 40. The potential changes established on the bit lines BL1, ..., BLn after controlling the respective selection transistors of the memory cells SZ11, ..., SZ1n into the on state and are amplified by the activated sense amplifiers in bit-line-specific fashion and thus influenced simultaneously by the capacitive load of the common data line. Consequently, the potential level on the respective bit lines BL1, ..., BLn changes a second time. On healthy bit lines, however, this disturbance is relatively small, so that at least the threshold value based on which the sense amplifier carries out its assessment is not exceeded or undershot in a direction other than the original direction. On sick bit lines, however, the disturbance is apparent such that the threshold value is exceeded, for example, if the bit line potential was previously below the threshold value. Since the activated sense amplifiers permanently detect and amplify the potential state on their respective bit line, the incorrect memory states are thus written back to sick memory cells or memory cells connected to sick bit lines. Such memory cells in which, for example, the first memory state is now written instead of the second memory state have not passed the functional test.

The connection of the bit lines to the common data line is effected momentarily, thereby ensuring that the potential states on the respective bit lines are influenced by the capacitive load of the common data line, but not by the potential state of other bit lines. The time during which, for example, the bit lines BL, ..., BLn are connected to the common data line is selected to avoid a potential equalization of the individual bit lines among one another.

Since the sense amplifiers, in the case of the method according to the invention, drive the local data line LDQ simultaneously, a sensible result cannot be read out at the data input and output terminal DIO. The actual read-out of the data contents that have possibly been written back erroneously into the memory cells is subsequently effected in a fast read access (fast page mode). In the context of this read access, the memory cells SZ11, ..., SZ1n along the word line WL1 are read successively, their memory state no longer being refreshed by the connected sense amplifiers.

If a read time $T_{RD} \approx 10$ ns is required for the fast read access to an individual memory cell, then a total test time $T_{Test} \approx TR+n*T_{RD}=64$ ms$+1024*10$ n$=64.01$ ms is required for carrying out the test method according to the invention. The time saved is approximately 65 s in comparison with the method used heretofor.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

List of Reference Symbols
10 memory cell array
20 sense amplifier strip
30 word line driver strip
31, 32 word line driver
40 control circuit
50 address register
60 controllable switch
70 amplifier
100 integrated semiconductor memory
SZ memory cell
AT selection transistor
SC storage capacitor
BL bit line
WL word line
VPP, VLL disturbance signal
LV sense amplifier
CSL control signal
LDQ common data line
CL load capacitance
MDQ main data line
CMD command signal
ACT activation command
WR write command
RD read command
TR data retention time
TRCD delay time (row address to column address delay)
DIO data input and output terminal
X word line address
Y bit line address

What is claimed:

1. A method for testing an integrated semiconductor memory, comprising:
 writing a first memory state to memory cells of a memory cell array of the integrated semiconductor memory;
 writing a second memory state to memory cells connected to a first word line;
 generating a disturbance signal for disturbing a memory state of memory cells connected to the first word line;
 low-impedance connecting the memory cells connected to the first word line to the bit line, a potential state forming on each bit line connected to one of the memory cells connected to the first word line;
 simultaneously connecting the bit lines connected to one of the memory cells connected to the first word line to the common data line so that the respective potential states of the bit lines connected to one of the memory cells connected to the first word line experience a disturbance brought about by a capacitive load of a common data line;

refreshing the disturbed memory state of the memory cells connected to the first word line by assessing the respectively disturbed potential states of the bit lines;

electrically disconnecting the bit lines connected to one of the memory cells connected to the first word line from the common data line, thereby avoiding a charge equalization between the bit lines connected to one of the memory cells connected to the first word line; and successively reading-out the respective memory state of the memory cells connected to the first word line.

2. The method for testing an integrated semiconductor memory as claimed in claim 1, further comprising:

generating a first level of the disturbance signal on a second word line by which the selection transistors of the memory cells connected to the second word line are turned on; and generating a second level of the disturbance signal on the second word line by which the selection transistors of the memory cells connected to the second word line are turned off.

3. The method for testing an integrated semiconductor memory as claimed in claim 2, further comprising:

generating the first and second levels of the disturbance signal on the second word line, the second word line lying beside the first word line.

4. The method for testing an integrated semiconductor memory as claimed in claim 2, further comprising:

generating the first and second levels of the disturbance signal on the second word line during the data retention time, wherein in order to prevent an alteration of the memory state, a memory state written to the memory cells is refreshed at the latest after the data retention time.

5. The method for testing an integrated semiconductor memory as claimed in claim 4, further comprising:

repeated refreshing of the memory state of the memory cells connected to the second word line, the second word line being driven with the first level of the disturbance signal during the data retention time.

6. The method for testing an integrated semiconductor memory as claimed in claim 2, further comprising:

turning on the respective selection transistors of the memory cells connected to the first word line; and driving sense amplifiers with a control signal such that the bit lines connected to one of the memory cells connected to the first word line are connected via the sense amplifiers simultaneously to a common data line.

7. The method for testing an integrated semiconductor memory as claimed in claim 6, further comprising:

generating a respective first potential change on the bit lines as a result of turning on the respective selection transistors of the memory cells connected to the first word line;

generating a respective second potential change on the respective bit lines as a result of the simultaneous connection of the bit lines connected to one of the memory cells connected to the first of the word lines via the sense amplifiers to the common data line;

evaluating the respective second potential change on the respective bit line by the sense amplifier connected to the respective bit line;

writing the first memory state back to the memory cell connected via the respective bit line to the respective sense amplifier and to the first of the word lines, if the second potential change lies above the threshold value; and writing the second memory state back to the memory cell connected via the respective bit line to the respective sense amplifier and to the first of the word lines, if the second potential change lies below the threshold value.

8. The method for testing an integrated semiconductor memory as claimed in claim 7, further comprising:

simultaneous connecting the bit lines connected to one of the memory cells connected to the first word line via the sense amplifiers to the common data line, a delay time between turning on the respective selection transistors of the memory cells connected to the first word line and the simultaneous connection of the bit lines connected to one of the memory cells connected to the first of the word lines to the common data line, delay time provided such that the sense amplifier connected to the respective bit line detects the potential change on the respective bit line for refreshing the memory state of the memory cell connected to the respective bit line.

9. The method for testing an integrated semiconductor memory as claimed in claim 1, further comprising:

comparing the respective memory state of the memory cells that have been read with the second memory state; and replacing the first word line by one of the redundant word lines, if the read-out memory state of one of the memory cells connected to the first word line differs from the second memory state.

10. An integrated semiconductor memory, comprising:

a memory cell array having memory cells connected to a bit line and a word line, the memory cells being connected to the respective bit line in low-impedance fashion in an activated state and in a high-impedance fashion in a deactivated state;

a data line;

sense amplifiers connecting the bit lines to the data line; and a control circuit activates the memory cells connected to a first word line, thereby forming a potential swing on each bit line connected to one of the activated memory cells, the control circuit simultaneously driving sense amplifiers with a control signal so that the bit lines connected to one of the activated memory cells are connected via the sense amplifiers simultaneously to the data line and subsequently isolated so that the respective potential swings of the bit lines connected to one of the activated memory cells experience a disturbance brought about by a capacitive load of the common data line, while avoiding a charge equalization between the activated memory cells by subsequent electrically decoupling of the bit lines from the common data line, and the respectively disturbed potential swings on the bit lines are assessed by the respective sense amplifiers for refreshing the respective memory cells.

11. The integrated semiconductor memory as claimed in claim 10, wherein the memory cells each have a selection transistor and a storage capacitor (SC), in the activated state of the memory cell, the storage capacitor is connected to the respective bit line connected to the memory cell in low-impedance fashion via the selection transistor in a on state, and in the deactivated state of the memory cell, the storage capacitor is connected to the respective bit line connected to the memory cell in high-impedance fashion via the selection transistor in an off state.

12. The method for testing an integrated semiconductor memory as claimed in claim 3, further comprising:
  generating the first and second levels of the disturbance signal on the second word line during the data retention time,
  wherein in order to prevent an alteration of the memory state, a memory state written to the memory cells is refreshed at the latest after the data retention time.

13. The method for testing an integrated semiconductor memory as claimed in claim 12, further comprising:
  repeated refreshing of the memory state of the memory cells connected to the second word line, the second word line being driven with the first level of the disturbance signal during the data retention time.

\* \* \* \* \*